(12) United States Patent
Wan et al.

(10) Patent No.: US 12,176,062 B2
(45) Date of Patent: Dec. 24, 2024

(54) MEMORY DEVICE

(71) Applicants: TAIWAN SEMICONDUCTOR MANUFACTURING COMPANY, LTD., Hsinchu (TW); TSMC Nanjing Company Limited, Nanjing (CN); TSMC China Company Limited, Shanghai (CN)

(72) Inventors: He-Zhou Wan, Shanghai (CN); Xiu-Li Yang, Shanghai (CN); Pei-Le Li, Nanjing (CN); Ching-Wei Wu, Nantou County (TW)

(73) Assignees: TAIWAN SEMICONDUCTOR MANUFACTURING COMPANY, LTD., Hsinchu (TW); TSMC NANJING COMPANY LIMITED, Nanjing (CN); TSMC CHINA COMPANY LIMITED, Shanghai (CN)

( * ) Notice: Subject to any disclaimer, the term of this patent is extended or adjusted under 35 U.S.C. 154(b) by 0 days.

(21) Appl. No.: 18/336,428

(22) Filed: Jun. 16, 2023

(65) Prior Publication Data

US 2023/0326501 A1    Oct. 12, 2023

Related U.S. Application Data

(63) Continuation of application No. 17/853,401, filed on Jun. 29, 2022, now Pat. No. 11,721,374, which is a
(Continued)

(30) Foreign Application Priority Data

Feb. 1, 2021    (CN) .......................... 202110136033.9

(51) Int. Cl.
*G11C 7/10*    (2006.01)
*G11C 5/14*    (2006.01)
(Continued)

(52) U.S. Cl.
CPC .............. *G11C 7/109* (2013.01); *G11C 5/147* (2013.01); *G11C 5/148* (2013.01); *G11C 7/1057* (2013.01);
(Continued)

(58) Field of Classification Search
CPC ......... G11C 7/109; G11C 5/147; G11C 5/148; G11C 7/1057; G11C 7/1063; G11C 7/1069; G11C 7/1084; G11C 7/1096; G11C 7/12
See application file for complete search history.

(56) References Cited

U.S. PATENT DOCUMENTS

2005/0117380 A1    6/2005    Kang
2005/0135141 A1    6/2005    Kang
(Continued)

FOREIGN PATENT DOCUMENTS

TW    I484489 B    5/2015

OTHER PUBLICATIONS

U.S. Appl. No. 17/853,401, filed Jun. 29, 2022.

*Primary Examiner* — Han Yang
(74) *Attorney, Agent, or Firm* — Birch, Stewart, Kolasch & Birch, LLP

(57) ABSTRACT

A memory device includes a memory array, a first latch and a first logic element. The memory array is configured to operate according to a first global write signal. The first latch is configured to generate a first latch write data based on a clock signal. The first logic element is configured to generate the first global write signal based on the clock signal and the first latch write data.

20 Claims, 9 Drawing Sheets

Related U.S. Application Data continuation of application No. 17/182,655, filed on Feb. 23, 2021, now Pat. No. 11,393,509.

(51) Int. Cl.
  *G11C 7/12* (2006.01)
  *G11C 8/10* (2006.01)

(52) U.S. Cl.
  CPC .......... *G11C 7/1063* (2013.01); *G11C 7/1069* (2013.01); *G11C 7/1084* (2013.01); *G11C 7/1096* (2013.01); *G11C 7/12* (2013.01); *G11C 8/10* (2013.01)

(56) References Cited

U.S. PATENT DOCUMENTS

| | | | |
|---|---|---|---|
| 2009/0086557 A1* | 4/2009 | Lee | G11C 11/4093 |
| | | | 365/233.1 |
| 2009/0279378 A1* | 11/2009 | Kwon | G11C 7/22 |
| | | | 365/233.1 |
| 2011/0292748 A1 | 12/2011 | Adams et al. | |
| 2014/0219039 A1 | 8/2014 | Jung et al. | |

* cited by examiner

MEMORY DEVICE

CROSS-REFERENCE TO RELATED APPLICATION

This application is a continuation application of U.S. application Ser. No. 17/853,401, filed Jun. 29, 2022, which is a continuation application of U.S. application Ser. No. 17/182,655, filed Feb. 23, 2021, now U.S. Pat. No. 11,393,509, issued Jul. 19, 2022, which claims priority to China Application Number 202110136033.9, filed Feb. 1, 2021, all of which are herein incorporated by reference.

BACKGROUND

Electronic equipment and electronic-based systems require some form of high-speed memory devices for storing and retrieving information. Random access memories (RAM) are commonly used in integrated circuits. Embedded RAM is particularly popular in high speed communication, image processing and system-on-chip (SOC) applications. A RAM incorporates an array of individual memory cells. A user may execute both read and write operations on the memory cells of a RAM. A typical example of a RAM is a dynamic random access memory (DRAM), as is well known in the art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
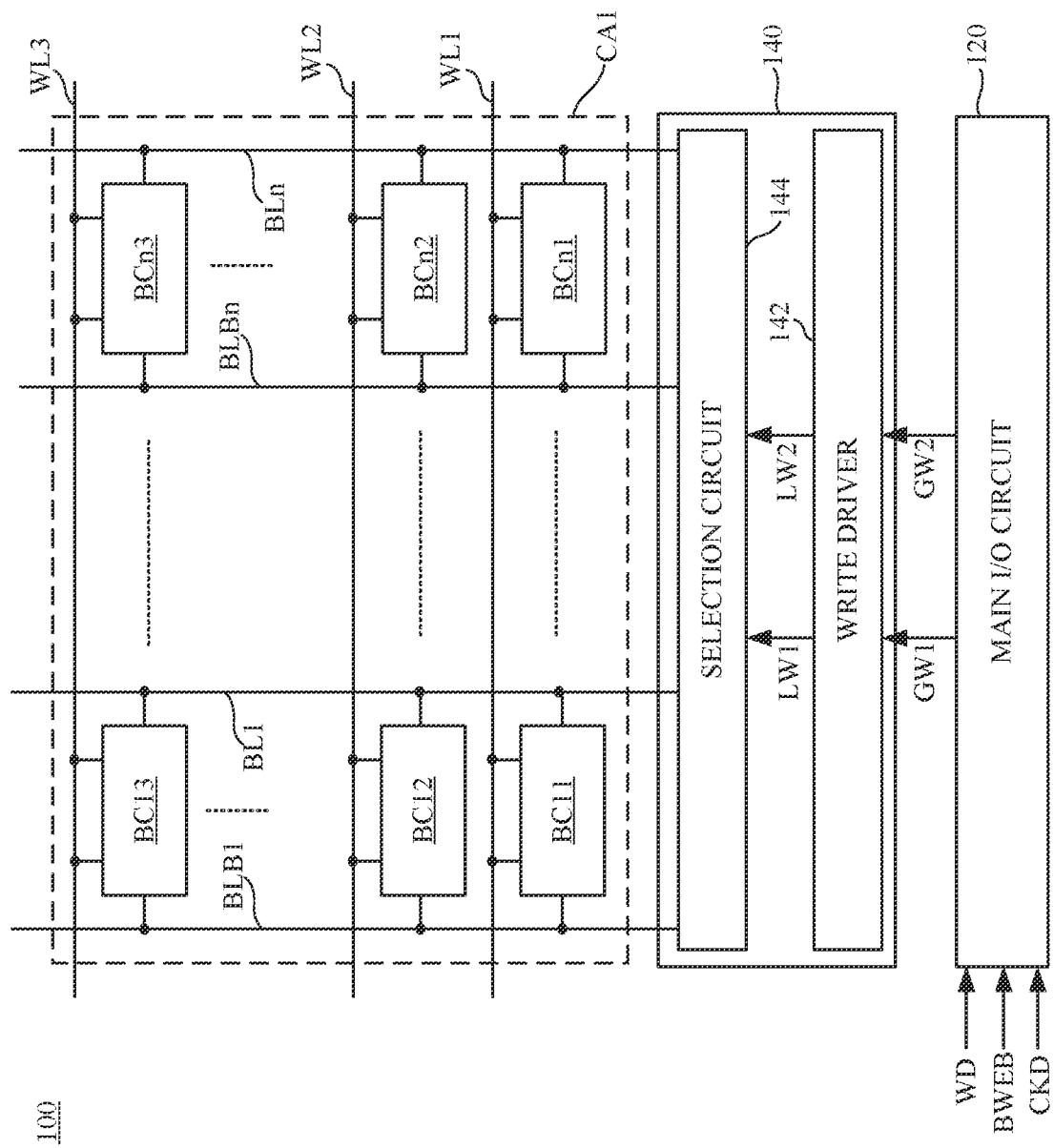
FIG. 1 is a schematic diagram illustrating a memory device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

FIG. 1 is a schematic diagram illustrating a memory device 100 in accordance with various embodiments of the present disclosure. In some embodiments, the memory device 100 is utilized to write digital data into bit cells BC11~BCn3 in a memory array CA1. These digital data can be stored in the bit cells BC11~BCn3, and can be read or access by the memory device 100 from the bit cells BC11~BCn3 in the memory array CA1.

As illustrated in FIG. 1, in some embodiments, the memory array CA1 can include several bit cells BC11~BCn3 arranged along n columns and 3 rows. Three rows are illustratively shown in FIG. 1 for demonstrational purpose, but the disclosure is not limited thereto. The bit cells on the same column are connected to the same bit line and the same complement bit line. For example, the bit cells BC11, BC12 and BC13 on the same column are connected to the bit line BL1 and also the complement bit line BLB1; the bit cells BCn1, BCn2 and BCn3 on the same column are connected to the bit line BLm and the complement bit line BLBm. The bit cells on the same row are connected to the same word line. For example, the bit cells BC11 and BCn1 on the same row are connected to the word line WL1; the bit cells BC12 and BCn2 on the same row are connected to the word line WL2; the bit cells BC13 and BCn3 on the same row are connected to the word line WL3.

As illustratively shown in FIG. 1, the memory device 100 include a main input/output (I/O) circuit 120 and a local I/O circuit 140. In some embodiments, the main I/O circuit 120 is configured to generate a global write signal GW1 and another global write signal GW2 according to a write data WD, a bit write mask signal BWEB and a clock signal CKD.

As illustratively shown in FIG. 1, local I/O circuit 140 includes a write driver 142 and a selection circuit 144. The write driver 142 of the local I/O circuit 140 is configured to generate a local write signal LW1 according to the global write signal GW1 and generate another local write signal LW2 according to the global write signal GW2. A selection circuit 144 is configured to select one target column from the memory array CA1, transmit the local write signal LW1 to the complement bit line (BLB1~BLBn) and transmit the local write signal LW2 to the bit line (BL1'~BLn) on the target column.

For example, in a normal write mode of the memory device 100, when the write data is logic "0" to be written into the bit cell BC11, the main I/O circuit 120 in some embodiments can generate the global write signal GW1 at a low level "L" and generate the global write signal GW2 at a high level "H". Accordingly, the write driver 142 generates the local write signal LW1 at the high level (in response to the global write signal GW1) and generate the local write signal LW2 at the low level (in response to the global write signal GW2). Since the write data is logic "0" to be written into the bit cell BC11, a selection signal YSEL1 is set at "H" level, and other selection signals (e.g., the selection signal YSELn) is set at "L" level. The selection circuit 144 turns on the NMOS transistor N1 by the selection signal YSEL1 at "H" level for transmitting the local write signal LW1 to the complement bit line BLB1, and turn on the NMOS transistor N2 by the selection signal YSEL1 at "H" level for transmitting the local write signal LW2 to the bit line BL1. In the meantime, the NMOS transistors N3 and N4 are turned off by the selection signal YSELn at "L" level. In this case, the word line WL1 is activated, and the word lines WL2-WL3 are deactivated; the bit cell BC11 is written according the bit line BL1, at "L" level, and the complement bit line BLB1, at "H" level.

On the other hand, in the normal write mode of the memory device 100, when the write data is logic "1" to be written into the bit cell BC11, the main I/O circuit 120 in some embodiments can generate the global write signal GW1 and the global write signal GW2 at the H/L levels. Accordingly, the write driver 142 generates the local write signal LW1 and the local write signal LW2 at the L/H levels. The selection circuit 144 transmits the local write signal LW1 to the complement bit line BLB1, and transmits the local write signal LW2 to the bit line BL1. In this case, the word line WL1 is activated, and the word lines WL2-WL3 are deactivated; the bit cell BC11 is written according the bit line BL1 "H" and the complement bit line BLB1 "L".

As discussed in aforesaid normal writing mode, data can be written into a target bit cell in the memory device 100. When the memory device 100 tends to write one bit data into one target bit cell, other bit cells around the target bit cell are required to be masked from these writing signals, or some write signals may affect these non-target bit cells. In some embodiments, the memory device 100 provide a function of bitwise write mask, which can protect data stored in the bit cells BC11~BCn3. Further details about how to implement the bitwise write mask will be discussed in the following paragraphs.

Figure 2:
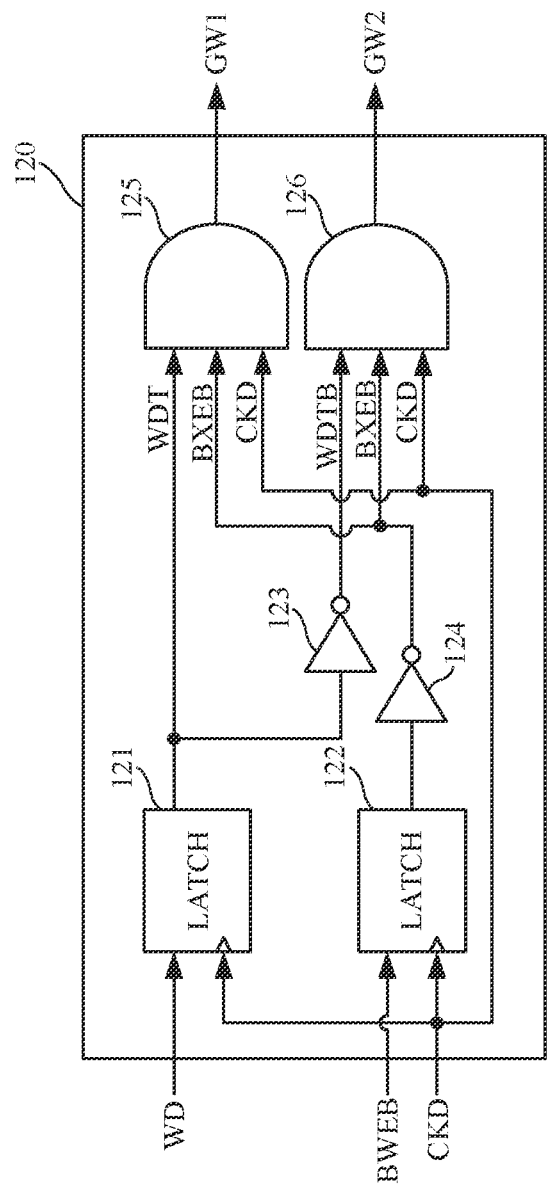
FIG. 2 is a schematic diagram illustrating a main I/O circuit in FIG. 1 in accordance with various embodiments of the present disclosure.
Figure 3:
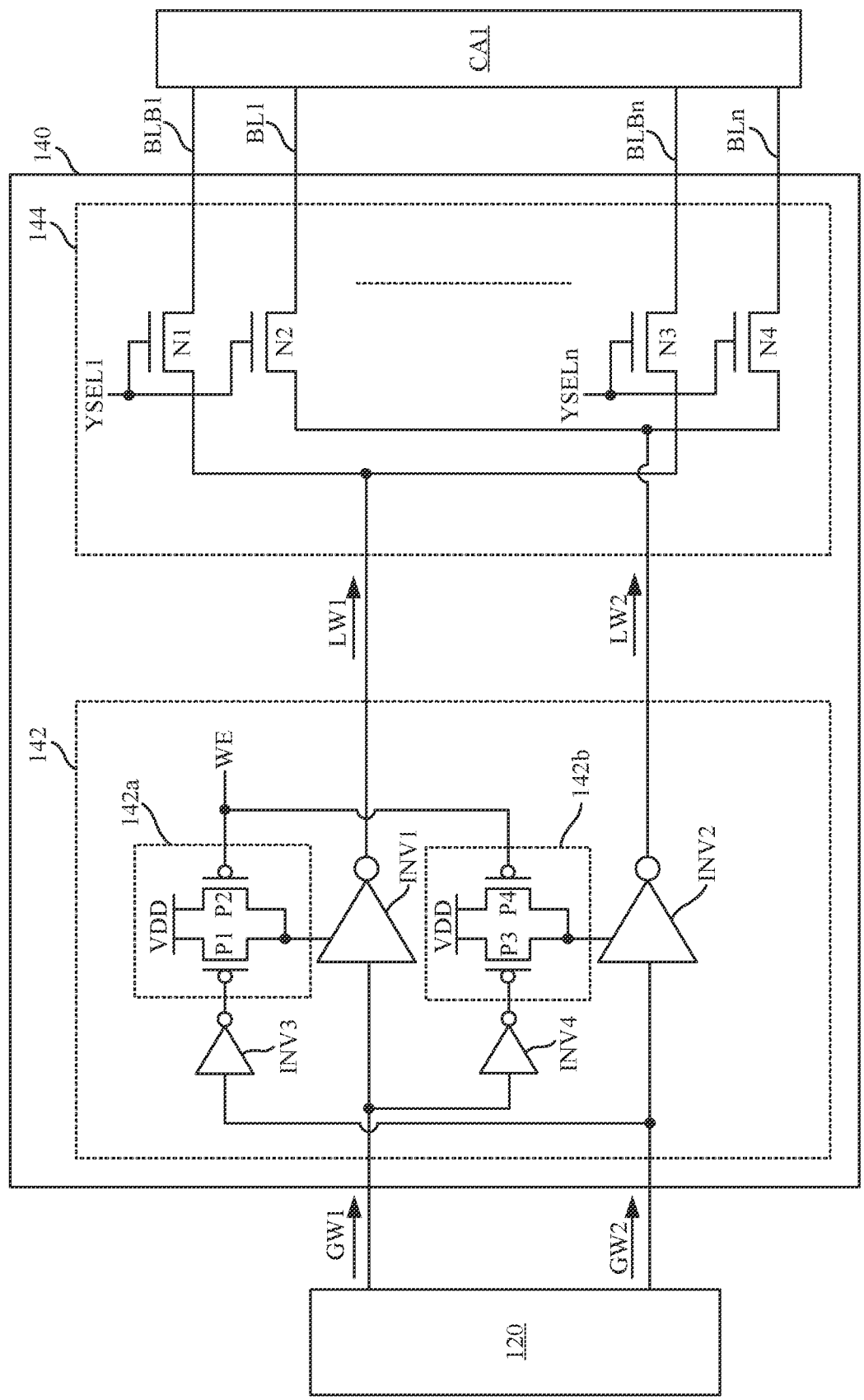
FIG. 3 is a schematic diagram illustrating the local I/O circuit in FIG. 1 in accordance with various embodiments of the present disclosure.
Figure 4:
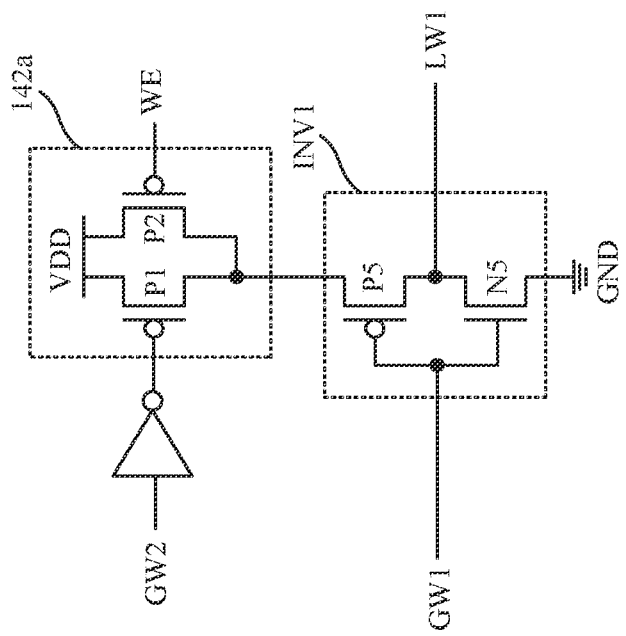
FIG. 4 is a schematic diagram illustrating an inverter and a header circuit in the local I/O circuit in FIG. 3 in accordance with various embodiments of the present disclosure.
Figure 5:
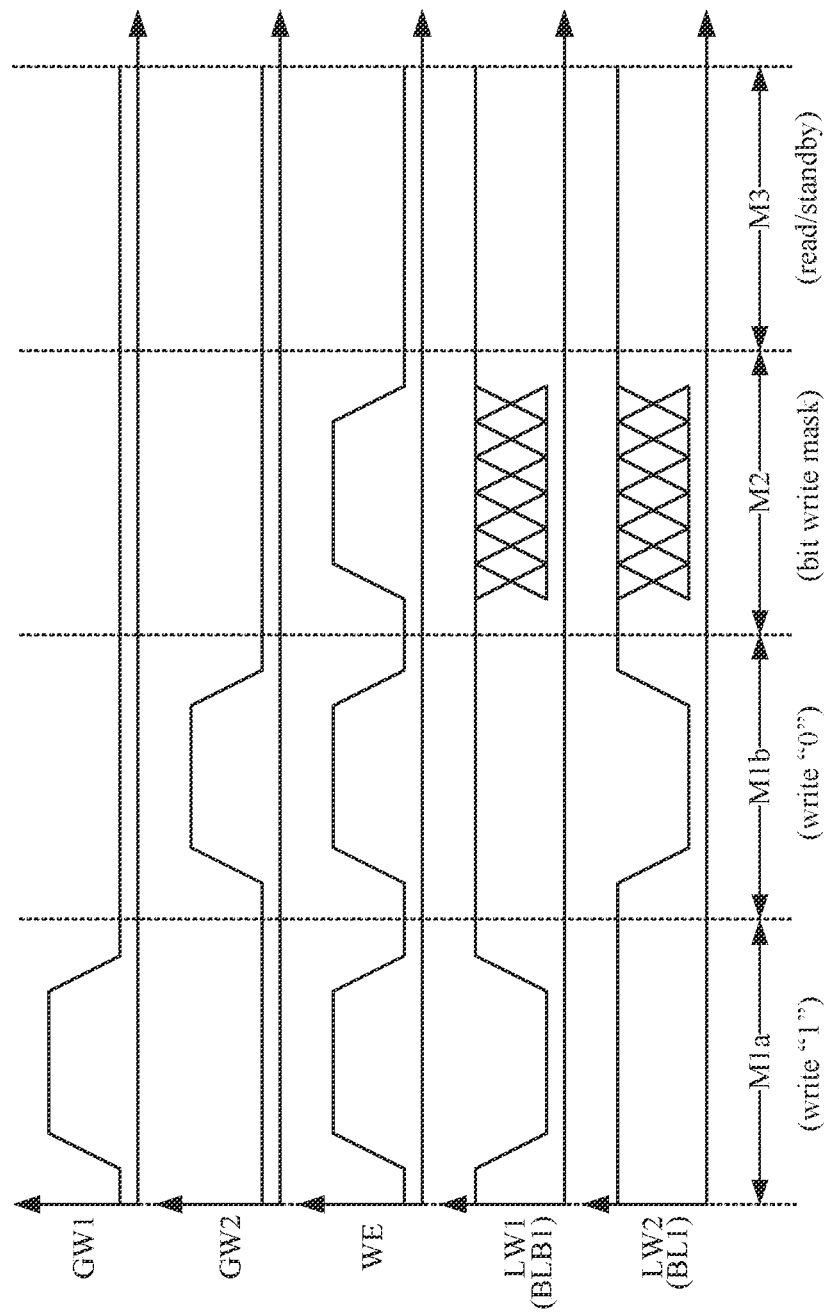
FIG. 5 is a signal waveform illustrating related signals generated in the memory device in FIG. 1 in accordance with various embodiments of the present disclosure.

Reference is further made to FIG. 2, FIG. 3, FIG. 4 and FIG. 5. FIG. 2 is a schematic diagram illustrating the main I/O circuit 120 in FIG. 1 in accordance with various embodiments of the present disclosure. FIG. 3 is a schematic diagram illustrating the local I/O circuit 140 in FIG. 1 in accordance with various embodiments of the present disclosure. FIG. 4 is a schematic diagram illustrating an inverter INV1 and a header circuit 142a in the local I/O circuit 140 in FIG. 3 in accordance with various embodiments of the present disclosure. FIG. 5 is a signal waveform illustrating related signals generated in the memory device 100 in FIG. 1 in accordance with various embodiments of the present disclosure. With respect to the embodiments of FIG. 1, like elements in FIG. 2, FIG. 3, FIG. 4 and FIG. 5 are designated with the same reference numbers for ease of understanding.

As shown in FIG. 2, the main I/O circuit 120 includes two latches 121 and 122, two inverters 123 and 124, and two AND gates 125 and 126 in some embodiments. The latch 121 receives the write data WD and is triggered by the clock CKD. The latch 122 receives the bit write mask signal BWEB and is triggered by the clock CKD. The AND gates 125 generates the global write signal GW1 according to a latch write data WDT, a reversed bit write mask signal BXEB and the clock CKD. The AND gates 126 generates the global write signal GW2 according to a reversed latch write data WDTB, the reversed bit write mask signal BXEB and the clock CKD.

As shown in FIG. 3, the write driver 142 in the local I/O circuit 140 includes an inverter INV1, another inverter INV2, a header circuit 142a and another header circuit 142b. The inverter INV1 is configured to convert the global write signal GW1 into the local write signal LW1. The inverter INV2 is configured to convert the global write signal GW2 into the local write signal LW2.

In some embodiments as illustratively shown in FIG. 3, the header circuit 142a is coupled between a power terminal of the inverter INV1 and a positive reference voltage supply VDD. The header circuit 142a is configured to connect or disconnect the power terminal of the inverter INV1 with the positive reference voltage supply VDD in response to a write enable signal WE and the global write signal GW2 (after inversion by an inverter INV3). As illustratively shown in FIG. 3, the header circuit 142a includes two PMOS transistors P1 and P2. The transistor P1 is coupled between the positive reference voltage supply VDD and the power terminal of the inverter INV1. A gate terminal of the PMOS transistor P1 is controlled by the global write signal GW2 after inversion by the inverter INV3. The PMOS transistor P2 is coupled between the positive reference voltage supply VDD and the power terminal of the inverter INV1 and in parallel with the PMOS transistor P1. A gate terminal of the PMOS transistor P2 is controlled by the write enable signal WE.

In some embodiments as illustratively shown in FIG. 3, the header circuit 142b is coupled between a power terminal of the inverter INV1 and a positive reference voltage supply VDD. The header circuit 142b is configured to connect or disconnect the power terminal of the inverter INV2 with the positive reference voltage supply VDD in response to the write enable signal WE and the global write signal GW1 (after inversion by an inverter INV4). As illustratively shown in FIG. 3, the header circuit 142b also includes two PMOS transistors P3 and P4. The transistor P3 is coupled between the positive reference voltage supply VDD and the power terminal of the inverter INV2. A gate terminal of the PMOS transistor P3 is controlled by the global write signal GW1 after inversion by the inverter INV4. The PMOS transistor P4 is coupled between the positive reference voltage supply VDD and the power terminal of the inverter INV2 and in parallel with the PMOS transistor P3. A gate terminal of the PMOS transistor P4 is controlled by the write enable signal WE.

As an example, in the normal write mode of the memory device 100, the write data WD "1" is to be written into the bit cell BC11, with reference to a time period M1a shown in FIG. 5. In this example, the bit write mask signal is set at "L" level; the reversed bit write mask signal BXEB is set at "H" level; the latch write data WDT is set at "H" level (according to the write data WD "1"); and the reversed latch write data WDTB is set at "L" level (according to the write data WD "1"). When the pulse of the clock CKD arrives, the global write signal GW1 is set to the "H" level (because WDT=H, BXEB=H and CKD=H) by the AND gate 125 in FIG. 2 as shown in a time period M1a shown in FIG. 5, and the global write signal GW2 is set to the "L" level (because WDTB=L) by the AND gate 126 in FIG. 2 as shown in the time period M1a shown in FIG. 5.

In the normal write mode (with WD="1", GW1=H and GW2=L), with reference to a time period M1a shown in FIG. 5, the write enable signal WE is set at the "H" level, such that the PMOS transistors P2 and P4 are turned off by the write enable signal WE. The PMOS transistor P1 is also turned off by the global write signal GW2 after inversion by the inverter INV3. The PMOS transistor P3 is also turned on by the global write signal GW1 after inversion by the inverter INV4. Since the PMOS transistors P1 and P2 in the header circuit 142a are turned off, the header circuit 142a disconnects the inverter INV1 from the positive reference voltage supply VDD. With reference to FIG. 4, the inverter INV1 shown in FIG. 4 is a CMOS inverter structure formed by a PMOS transistor P5 and a NMOS transistor N5. The inverter INV1 formed in the CMOS inverter structure shown in FIG. 4 is shown as a demonstrational example. The inverters INV1 and INV2 can be formed by any equivalent inverter structure. In this case (with WD="1", GW1=H and GW2=L), the power terminal of the inverter INV1 is disconnected from the positive reference voltage supply VDD, and the global write signal GW1 turns on the NMOS transistor N5 in the inverter INV1, such that the local write signal LW1 is pulled low to a ground level, as shown in the time period M1a shown in FIG. 5. In the meantime, the header circuit 142b connects the inverter INV2 to the positive reference voltage supply VDD, such that the inverter INV2 converts the global write signal GW2 (GW2=L) into the local write signal LW2 (LW2=H) as shown in the time period M1a shown in FIG. 5. In this case, in response to the normal write mode with WD="1", the local write signal LW1 toward the complement bit line BLB1 is set to the is set to "L" level, and the local write signal LW2 toward the bit line BL1 is set to "H" level as shown in a time period M1a shown in FIG. 5.

On the other hand, as an example, in the normal write mode of the memory device 100, the write data WD "0" is to be written into the bit cell BC11, with reference to a time period M1b shown in FIG. 5. When the pulse of the clock CKD arrives, the global write signal GW1 is set to the "L" level (because WDT=L) by the AND gate 125 as shown in a time period M1b shown in FIG. 5, and the global write signal GW2 is set to the "H" level (because WDTB=H, BXEB=H and CKD=H) by the AND gate 126 as shown in a time period M1b shown in FIG. 5.

In the normal write mode (with WD="0", GW1=L and GW2=H), with reference to a time period M1b shown in FIG. 5, the write enable signal WE is set at the "H" level, such that the PMOS transistors P2 and P4 are turned off by the write enable signal WE. The PMOS transistor P3 is turned off by the global write signal GW1 after inversion by the inverter INV4. The PMOS transistor P1 is turned on by the global write signal GW2 after inversion by the inverter INV3. The header circuit 142b disconnects the inverter INV2 from the positive reference voltage supply VDD. The local write signal LW2 can be pulled low by an internal transistor (not shown in figure) in the inverter INV2 (with reference to the NMOS N5 of the inverter INV1 in FIG. 4). In the meantime, the header circuit 142a connects the inverter INV1 to the positive reference voltage supply VDD, such that the inverter INV1 converts the global write signal GW1 (GW1=L) into the local write signal LW1 (LW1=H) as shown in the time period M1b shown in FIG. 5.

In the bit write mask mode of the memory device 100, with reference to a time period M2 shown in FIG. 5, the bit write mask signal BWEB is set at "H" level, and the reversed bit write mask signal BXEB is fixed at "L" level. Therefore, both of the global write signals GW1 and GW2 are set at "L" level, as shown in a time period M2 shown in FIG. 5, regardless of the write data WD. During the time period M2, the write enable signal WE is set at the "H" level, such that the PMOS transistors P2 and P4 are turned off by the write enable signal WE. The PMOS transistor P1 is turned off by the global write signal GW2 after inversion by the inverter INV3. The PMOS transistor P3 is turned off by the global write signal GW1 after inversion by the inverter INV4. In the bit write mask mode of the memory device 100, the header circuit 142a disconnects the power terminal of the inverter INV1 from the positive reference voltage supply VDD, and the header circuit 142b disconnects the power terminal of the inverter INV2 from the positive reference voltage supply VDD. Further referring to FIG. 4, the global write signal GW1 turns off the NMOS transistor N5 in the inverter INV1. In this case, the inverter INV1 is disconnected from the positive reference voltage supply VDD, and the local write signal LW1 is configured in a floating state or a high-impedance state (Hi-Z) as shown in the time period M2 of FIG. 5. Similarly, the local write signal LW2 is configured in the floating state or the high-impedance state (Hi-Z), because the inverter INV2 is also disconnected from the positive reference voltage supply VDD.

Based on aforesaid embodiments, in the bit write mask mode of the memory device 100, the main I/O circuit 120 sets both of the global write signals GW1 and GW2 at "L" level and the write driver 142 accordingly sets the both of the local write signals LW1 and LW2 in the floating state or the high-impedance state (Hi-Z). When the local write signals LW1 and LW2 are transmitted by the selection circuit 144 to one complement bit line BLB1 and one bit line BL1, the local write signals LW1 and LW2 in the floating state or the high-impedance state (Hi-Z) do not overwrite or change the bit data stored in one bit cell (e.g., the bit cell BC11) connected with the complement bit line BLB1 and the bit line BL1, such that the memory device 100 is able to provide a bit write mask function for protecting the data in the bit cell. With the bit write mask function, the bit data stored in bit cells in the memory device 100 are more stable and reliable.

In a read mode or a standby mode of the memory device 100, the clock signal CKD is fixed at "L". Therefore, both of the global write signals GW1 and GW2 are set at "L" level, as shown in a time period M3 shown in FIG. 5, regardless of the write data WD and the bit write mask signal BWEB.

In the read mode or the standby mode of the memory device 100, with reference to the time period M3 shown in FIG. 5, the write enable signal WE is set at "L" level because the memory device 100 is currently not performing a write-related operation. The PMOS transistors P2 and P4 are turned on by the write enable signal WE (WE=L). The header circuit 142a connects the power terminal of the inverter INV1 to the positive reference voltage supply VDD, and the header circuit 142b connects the power terminal of the inverter INV2 to the positive reference voltage supply VDD. In this case, the inverter INV1 is activated to convert the global write signal GW1 (GW1=L) into the local write signal LW1 (LW1=H), and the inverter INV2 is activated to convert the global write signal GW2 (GW2=L) into the local write signal LW2 (LW2=H). During the read mode or the standby mode of the memory device 100, as shown in the time period M3 in FIG. 5, the write driver 142 is able to clamp the voltage levels of the local write signals LW1 and LW2 at "H" level. Since the voltage levels of the local write signals LW1 and LW2 are clamped at "H" level, no additional switching power is consumed during the read mode or the standby mode of the memory device 100.

It is noticed that the main I/O circuit 120 in embodiments in FIG. 2 generate the global write signals GW1 and GW2 according to the same clock signal CKD. In other words, the global write signals GW1 and GW2 are in the same time domain related to the clock signal CKD. In some embodiments, the write enable signal WE is also in the same time domain related to the clock signal CKD. The normal write mode, the bit write mask mode, the read mode or the standby mode in aforesaid embodiments are switched in the local I/O circuit 140 according to the global write signals GW1/GW2 and the write enable signal WE in the time domain relative to the clock signal CKD.

In some other examples, the bit write mask function is performed according to another control signal (e.g., a bit-line equalizing signal BLEQB) from another time domain, and a signal racing problem may occur between a control signal (e.g., global write signals GW1 or GW2) in the local time domain and the control signal (e.g., BLEQB) from another time domain. Compared to these examples with the control signal from other time domain, the main I/O circuit 120 and the local I/O circuit 140 with reference to the global write signals GW1/GW2 and the write enable signal WE in the local time domain can avoid a signal racing problem and also avoid a crowbar current caused by the signal racing problem.

Figure 6:
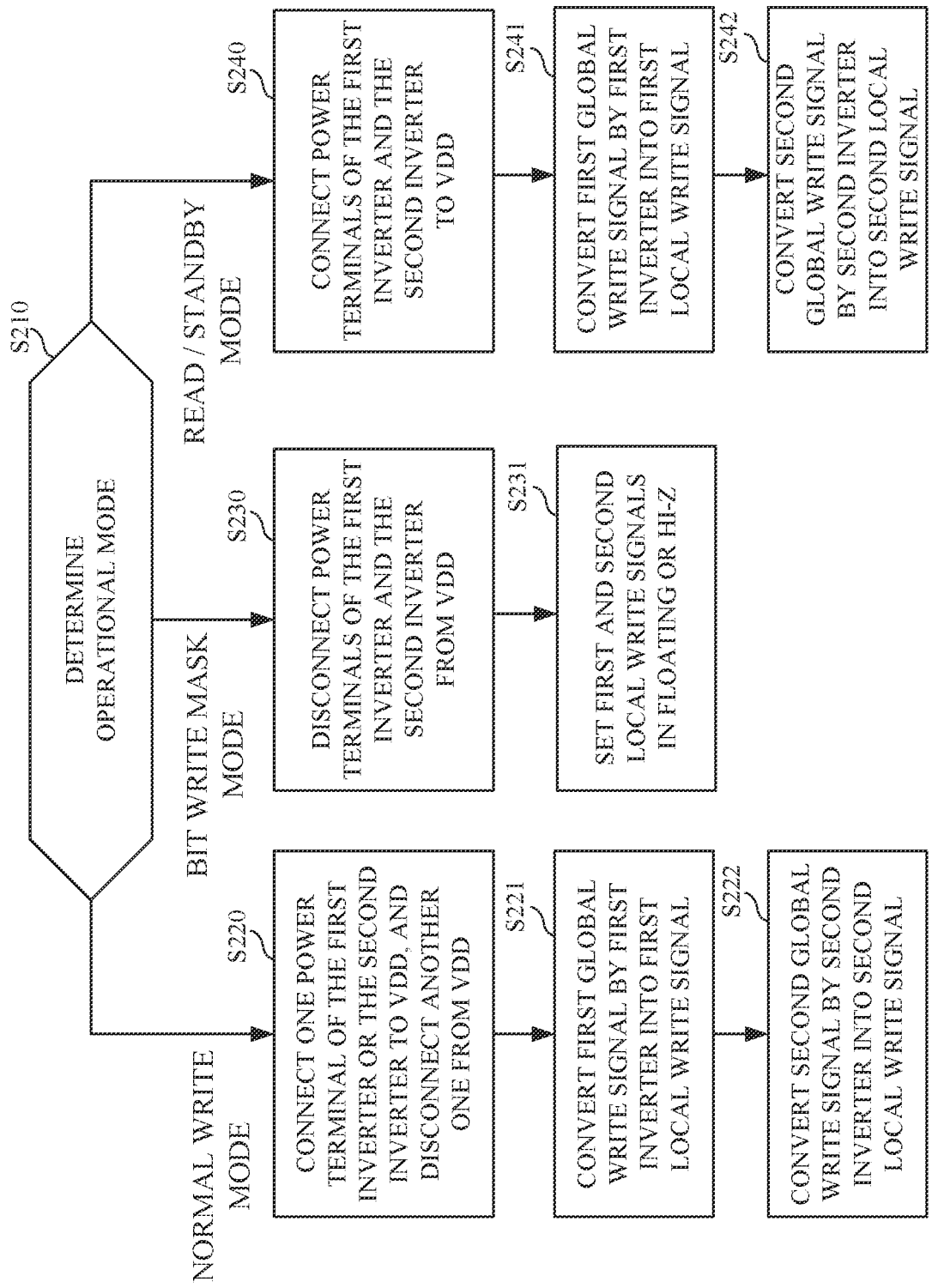
FIG. 6 is a flow chart diagram illustrating a control method in accordance with various embodiments of the present disclosure.

Reference is further made to FIG. 6. FIG. 6 is a flow chart diagram illustrating a control method 200 in accordance with various embodiments of the present disclosure. In some embodiment, the control method 200 in FIG. 6 can be utilized on the memory device 100 as shown embodiments in FIG. 1 to FIG. 5. As shown in FIG. 6, operation S210 is performed to determine an operational mode of the memory device 100.

As shown in FIG. 1, FIG. 3 and FIG. 6, when the memory device 100 is operated in the normal write mode, operation S220 is performed to connect one power terminal of the inverter INV1 or INV2 to the positive reference voltage supply VDD, and disconnect another one power terminal of the inverter INV1 or INV2 from the positive reference voltage supply VDD. Operation S221 is performed to convert the global write signal GW1 by the inverter INV1 into the local write signal LW1 transmitted to one of the complement bit lines BLB1~BLBn, with reference to embodiments about the time period M1a or M1b shown in FIG. 5. Operation S222 is performed to convert the global write signal GW2 by the inverter INV2 into the local write signal LW2 transmitted to one of the bit lines BL1~BLn, with reference to embodiments about the time period M1a or M1b shown in FIG. 5.

As shown in FIG. 1, FIG. 3 and FIG. 6, when the memory device 100 is operated in the bit write mask mode, operation S230 is performed to disconnect both power terminals of the inverters INV1 and INV2 from the positive reference voltage supply VDD. Operation S231 is performed to set the local write signal LW1 and the local write signal LW2 in the floating state or the Hi-Z state, with reference to embodiments about the time period M2 shown in FIG. 5.

As shown in FIG. 1, FIG. 3 and FIG. 6, when the memory device 100 is operated in the read mode or the standby mode, operation S240 is performed to connect both power terminals of the inverters INV1 and INV2 to the positive reference voltage supply VDD. Operation S241 is performed to convert the global write signal GW1 by the inverter INV1 into the local write signal LW1 transmitted to one of the complement bit lines BLB1~BLBn, with reference to embodiments about the time period M3 shown in FIG. 5. Operation S242 is performed to convert the global write signal GW2 by the inverter INV2 into the local write signal LW2 transmitted to one of the bit lines BL1~BLn, with reference to embodiments about the time period M3 shown in FIG. 5.

In aforesaid embodiments, the bit write mask mode in the memory device 100 is implemented by the header circuit 142a coupled between the inverter INV1 in the write driver 142 and the positive reference voltage supply VDD and the header circuit 142b coupled between the inverter INV2 in the write driver 142 and the positive reference voltage supply VDD.

In some other embodiments, the disclosure is not limited to implement the header circuits to the inverters INV1/INV2 in the write driver 142, and similar header circuits can be implemented in a decoder for controlling the selection circuit 144, so as to achieve operational modes including the normal write mode, the bit write mask mode and the read/standby mode.

Figure 7:
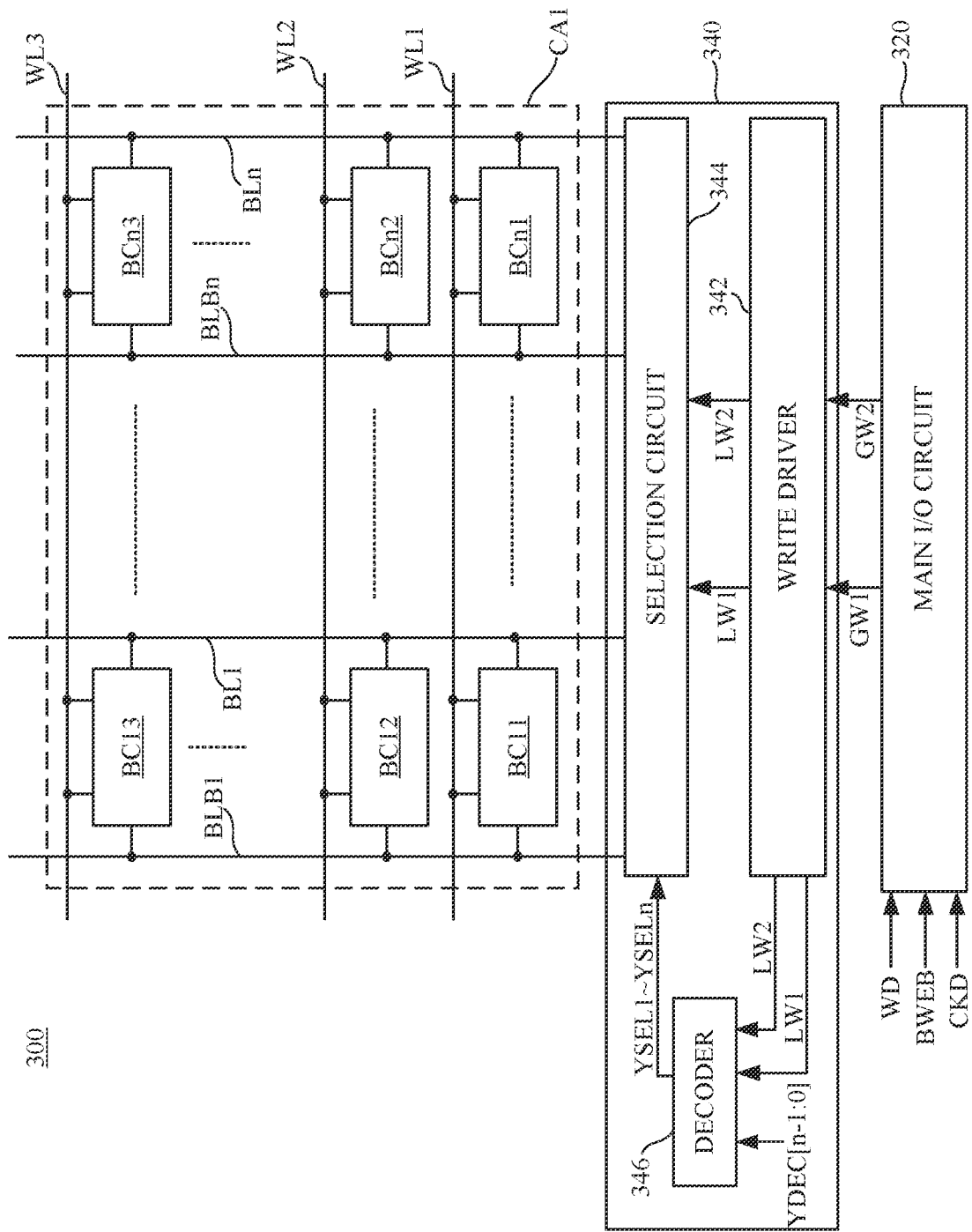
FIG. 7 is a schematic diagram illustrating another memory device in accordance with various embodiments of the present disclosure.

FIG. 7 is a schematic diagram illustrating another memory device 300 in accordance with various embodiments of the present disclosure. In some embodiments, the memory device 300 is utilized to write digital data into bit cells BC11~BCn3 in a memory array CA1 These digital data can be stored in the bit cells BC11~BCn3, and can be read or access by the memory device 300 from the bit cells BC11~BCn3 in the memory array CA1.

As illustrated in FIG. 7, in some embodiments, the memory array CA1 can include several bit cells BC11~BCn3 arranged along n columns and 3 rows. The bit cells on the same column are connected to the same bit line and the same complement bit line. For example, the bit cells BC11, BC12 and BC13 on the same column are connected to the bit line BL1 and also the complement bit line BLB1; the bit cells BCn1, BCn2 and BCn3 on the same column are connected to the bit line BLm and the complement bit line BLBm. The bit cells on the same row are connected to the same word line. For example, the bit cells BC11 and BCn1 on the same row are connected to the word line WL1. The embodiments shown in FIG. 7 with the bit cells BC11~BCn3 arranged along n columns and 3 rows are illustrated for illustrative purposes. In some other embodiments, the memory array CA1 can include different configurations, such as different amounts of columns and rows. Other configurations about columns and rows of the bit cells are within the scope of this disclosure.

As illustratively shown in FIG. 7, the memory device 300 include a main input/output (I/O) circuit 320 and a local I/O circuit 340. In some embodiments, the main I/O circuit 320 is configured to generate a global write signal GW1 and another global write signal GW2 according to a write data WD, a bit write mask signal BWEB and a clock signal CKD. The behaviors and functions of the main I/O circuit 320 in FIG. 7 is similar to the main I/O circuit 120 in aforesaid embodiments shown in FIG. 1 and FIG. 2. Details about how the main I/O circuit 320 generates a global write signal GW1 and another global write signal GW2 according to the write data WD, the bit write mask signal BWEB and the clock signal CKD are understood with reference to the main I/O circuit 120 in aforesaid embodiments shown in FIG. 1 and FIG. 2, and not to be repeated here again.

As illustratively shown in FIG. 7, the local I/O circuit 340 includes a write driver 342, a selection circuit 344 and a decoder 346.

In some embodiments, the write driver 342 of the local I/O circuit 340 is configured to generate a local write signal LW1 according to the global write signal GW1 and generate another local write signal LW2 according to the global write signal GW2. A selection circuit 344 is configured to select one target column from the memory array CA1, transmit the local write signal LW1 to the complement bit line (BLB1~BLBn) and transmit the local write signal LW2 to the bit line (BL1'~BLn) on the target column. The selection circuit 344 is controlled by the selection signals YSEL1~YSELn from the decoder 346.

In some embodiments, the decoder 346 is configured to generate the selection signals YSEL1~YSELn according to a decode signal YDEC[n−1:0], the local write signal LW1 and the local write signal LW2.

For example, the decode signal YDEC[n−1:0] can be a N-digits signal. The decoder 346 can generate the selection signal YSEL1 according to one bit from the decode signal YDEC[n−1:0]. For example, the decoder 346 can generate the selection signal YSEL1 in reference with the least significant bit (LSB) of the N-digits decode signal YDEC[n−1:0], and the decoder 346 can generate the selection signal YSELn in reference with the most significant bit (MSB) of the N-digits decode signal YDEC[n−1:0]. In some embodiments, the generation of the selection signals YSEL1~YSELn of the decoder 346 is further affected by the voltage levels of the local write signal LW1 and the local write signal LW2.

Figure 8:
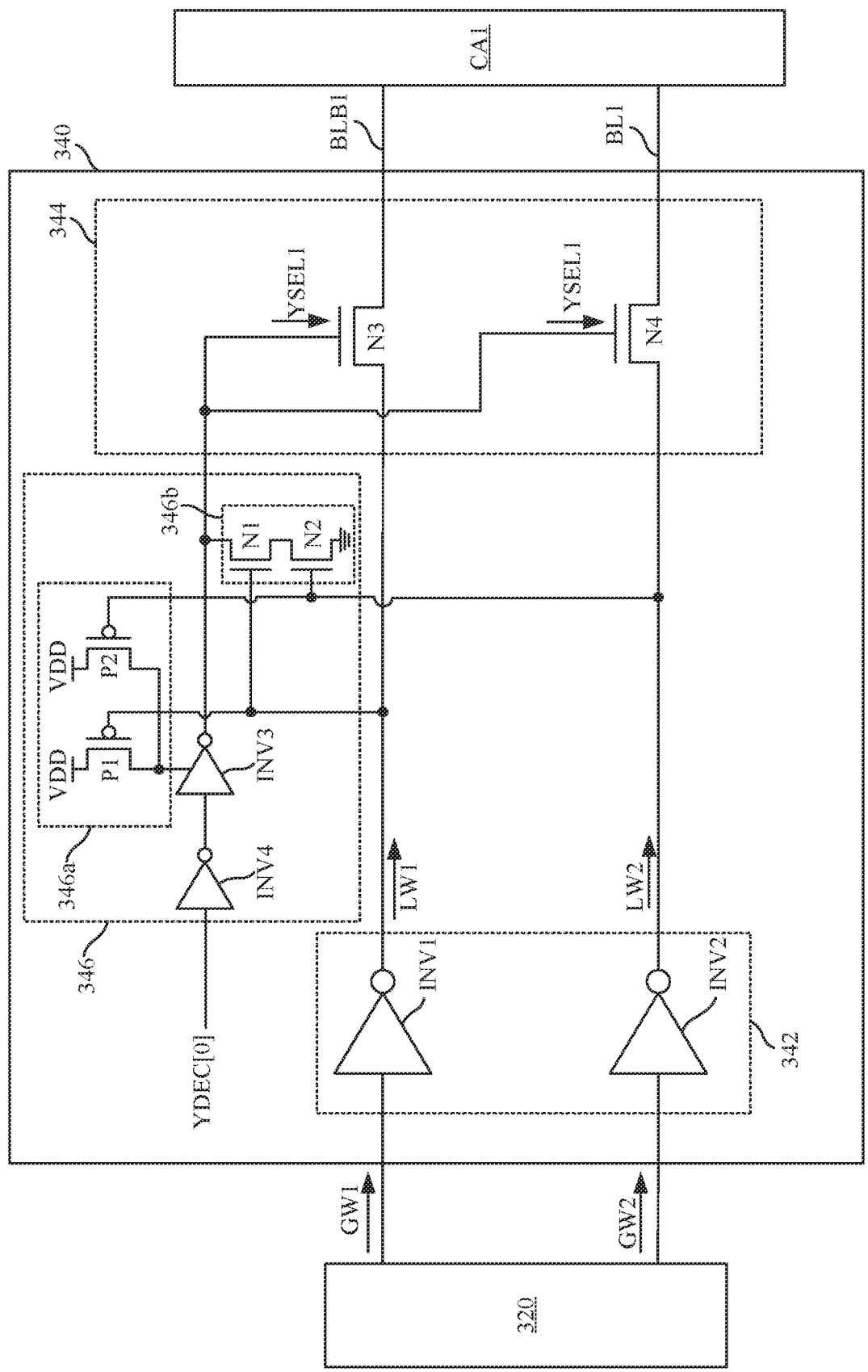
FIG. 8 is a schematic diagram illustrating the local I/O circuit in FIG. 7 in accordance with various embodiments of the present disclosure.
Figure 9:
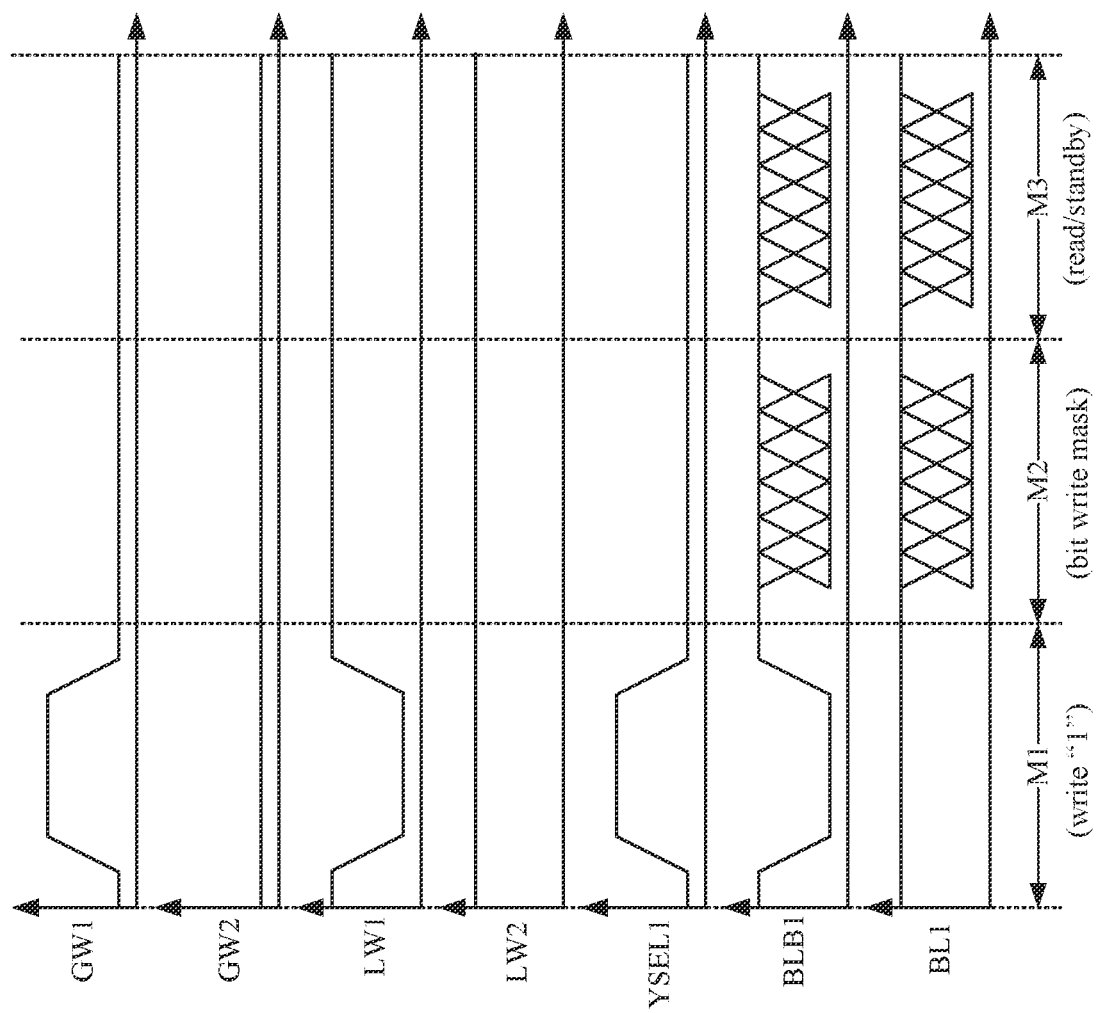
FIG. 9 is a signal waveform illustrating related signals generated in the memory device in FIG. 7 in accordance with various embodiments of the present disclosure.

FIG. 8 is a schematic diagram illustrating the local I/O circuit 340 in FIG. 7 in accordance with various embodiments of the present disclosure. FIG. 9 is a signal waveform illustrating related signals generated in the memory device 300 in FIG. 7 in accordance with various embodiments of the present disclosure. With respect to the embodiments of FIG. 7, like elements in FIG. 8 and FIG. 9 are designated with the same reference numbers for ease of understanding.

As shown in FIG. 8, the write driver 342 in the local I/O circuit 140 includes an inverter INV1 and another inverter INV2. The inverter INV1 is configured to convert the global write signal GW1 into the local write signal LW1. The inverter INV2 is configured to convert the global write signal GW2 into the local write signal LW2. As shown in FIG. 8, the selection circuit 344 includes the NMOS transistor N3 and the NMOS transistor N4.

It is noticed that, for brevity, the selection circuit 344 illustrated in FIG. 8 only show the NMOS transistor N3 for transmitting the local write signal LW1 to the complement bit line BLB1, and the NMOS transistor N4 for transmitting the local write signal LW2 to the bit line BL1. However, the selection circuit 344 includes further NMOS transistors for transmitting the local write signal LW1 to different complement bit line (e.g., BLBn) in the memory array CA1, and further NMOS transistors for transmitting the local write signal LW2 to different bit line (e.g., BLn) in the memory array CAL The structure of the selection circuit 344 is known by a person in the art. For brevity and clarity, partial structures of the selection circuit 344 relative to the bit line BL1 and the complement bit line BLB1 are illustrated in FIG. 8. For the same reason, the decoder 346 illustrated in FIG. 8 only shows partial structures for generating one selection signal YSEL1 relative to the NMOS transistors N3 and N4 (for BL1, BLB1) in the selection circuit 344. In some embodiments, the decoder 346 includes duplicated structures as illustrated in FIG. 8 for generating other selection signals (e.g., YSELn) to the selection circuit 344.

As shown in FIG. 8, in some embodiments, the decoder 346 generates the selection signal YSEL1 according to the local write signal LW1, the local write signal LW2 and a one-bit decode signal YDEC[0]. In some embodiments, the one-bit decode signal YDEC[0] is the least significant bit from the N-digits decode signal YDEC[n−1:0].

As shown in FIG. 8, the decoder circuit includes an inverter INV3, another inverter INV4, a header circuit 346a and a pull low circuit 346b. The inverter INV4 receives the one-bit decode signal YDEC[0]. An input of the inverter INV3 is coupled to an output of the inverter INV4. In some embodiments, the header circuit 346a connects or disconnects a power terminal of the inverter INV3 with a positive reference voltage supply VDD in response to the local write signal LW1 and the local write signal LW2. In some embodiments as illustratively shown in FIG. 8, the header circuit 346a includes a PMOS transistor P1 and another PMOS transistor P2. The PMOS transistor P1 is coupled between the positive reference voltage supply VDD and the power terminal of the inverter INV3. A gate terminal of the PMOS transistor P1 is controlled by the local write signal LW1. The PMOS transistor P2 is coupled between the positive reference voltage supply VDD and the power terminal of the inverter INV3. The PMOS transistor P2 is connected in parallel with the transistor P3.

In some embodiments, the pull low circuit—is coupled between an output terminal of the decoder circuit 346 and a ground terminal. The output terminal of the decoder circuit 346 is connected to the selection circuit 344 for providing the selection signal YSEL1 toward the selection circuit 344. The pull low circuit 346b is configured to pull low the voltage level of the selection signal YSEL1 in response to the local write signal LW1 and the local write signal LW2. In some embodiments as illustratively shown in FIG. 8, the pull low circuit 346b includes a NMOS transistor N1 and another NMOS transistor N2. The NMOS transistor N1 is coupled between the output terminal of the decoder circuit 346 and the ground terminal. A gate terminal of the NMOS transistor N1 is controlled by the local write signal LW1. The NMOS transistor N2 is also coupled between the output terminal of the decoder circuit 346 and the ground terminal. The NMOS transistor N2 is connected in series with the NMOS transistor N1 in a cascade structure between the output terminal of the decoder circuit 346 and the ground terminal. A gate terminal of the NMOS transistor N2 is controlled by the local write signal LW2.

For illustration, in a normal write mode of the memory device 300, when the write data is logic "1" to be written into the bit cell BC11 (the one-bit decode signal YDEC[0] =1), with reference to a time period M1 shown in FIG. 9, the main I/O circuit 320 sets the global write signal GW1 to "H" level and set the global write signal GW2 to "L" level in reference with WD=1, BWEB=0 and CKD=1. Details about the main I/O circuit 320 are understood with reference to aforementioned main I/O circuit 120 discussed in embodiments in FIG. 1 and FIG. 2. In this case, the inverter INV1 converts the global write signal GW1 into the local write signal LW1 at "L" level, and the inverter INV2 converts the global write signal GW2 into the local write signal LW2 at "H" level. Due to the local write signal LW1 is at "L" level, the NMOS transistor N1 in the pull low circuit 346b is turned off, such that the pull low circuit 346b does not pull low the voltage level of the selection signal YSEL1. In the meantime, because of the local write signal LW1 at "L" level, the PMOS transistor P1 in the header circuit 346a is turned on, such that the header circuit 346a connects the power terminal of the inverter INV3 with the positive reference voltage supply VDD. In this case, the inverter INV4 and the inverter INV3 works normally to generate the selection signal YSEL1 at "H" level according to the one-bit decode signal YDEC[0]. In this case, the transistors N3 and N4 in the selection circuit 344 is turned on by the selection signal YSEL1 at "H" level, such that the local write signal LW1 at "L" level is transmitted to the complement bit line BLB1 and the local write signal LW2 at "H" level is transmitted to the bit line BL1, in the normal write mode as shown in the time period M1 shown in FIG. 9.

Similarly, when the write data is logic "0" to be written into the bit cell BC11 (the one-bit decode signal YDEC[0] =1), the local write signals LW1 and LW2 with opposite levels (not shown in FIG. 9) and the selection signal YSEL1 will also be set at "H" level to complete the function of the normal write mode.

In the bit write mask mode of the memory device 300, with reference to a time period M2 shown in FIG. 9, the bit write mask signal BWEB will be set at "H" level, and both of the global write signals GW1 and GW2 will set at "L" level by the main I/O circuit 320, as shown in the time period M2 shown in FIG. 5, regardless of the write data WD. In this case, the inverter INV1 will convert the global write signal GW1 into the local write signal LW1 at "H" level, and the inverter INV2 will convert the global write signal GW2 into the local write signal LW2 at "H" level. Since both of the local write signals LW1 and LW2 are at "H" level, the NMOS transistors N1 and N2 in the pull low circuit 346b are turned on to pull low the voltage level of the selection signal YSEL1. In the meantime, because both of the local write signals LW1 and LW2 are at "H" level, the PMOS transistors P1 and P2 in the header circuit 346a are turned off, so as to disconnect the power terminal of the inverter INV3 from the positive reference voltage supply VDD. In this case, the selection signal YSEL1 will be fixed to a ground level, and that the transistors N3 and N4 in the selection circuit 344 is turned off by the selection signal YSEL1 at "L" level, such that the local write signal LW1 will not be transmitted to the complement bit line BLB1 and the local write signal LW2 will not be transmitted to the bit line BL1, in the bit write mask mode as shown in the time period M2 shown in FIG. 9.

Based on aforesaid embodiments, in the bit write mask mode of the memory device 300, the voltage levels of the complement bit line BLB1 and the bit line BL1 will be set in the floating state or the high-impedance state (Hi-Z). The complement bit line BLB1 and the bit line BL1 in the floating state or the high-impedance state (Hi-Z) will not overwrite or change the bit data stored in one bit cell (e.g., the bit cell BC11), such that the memory device 300 is able to provide a bit write mask function for protecting the data in the bit cell. With the bit write mask function, the bit data stored in bit cells in the memory device 300 will be more stable and reliable.

In a read mode or a standby mode of the memory device 300, the clock signal CKD will be fixed at "L". Therefore, both of the global write signals GW1 and GW2 will set at "L" level, as shown in a time period M3 shown in FIG. 9, regardless of the write data WD and the bit write mask signal BWEB. In this case, the inverter INV1 will convert the global write signal GW1 into the local write signal LW1 at "H" level, and the inverter INV2 will convert the global write signal GW2 into the local write signal LW2 at "H" level. Since both of the local write signals LW1 and LW2 are at "H" level, the NMOS transistors N1 and N2 in the pull low circuit 346b are turned on to pull low the voltage level of the selection signal YSEL1. In the meantime, because both of the local write signals LW1 and LW2 are at "H" level, the PMOS transistors P1 and P2 in the header circuit 346a are turned off, so as to disconnect the power terminal of the inverter INV3 from the positive reference voltage supply VDD. In this case, the selection signal YSEL1 will be fixed to a ground level, and that the transistors N3 and N4 in the selection circuit 344 is turned off by the selection signal YSEL1 at "L" level, such that the local write signal LW1 will not be transmitted to the complement bit line BLB1 and the local write signal LW2 will not be transmitted to the bit line BL1, in the read mode or the standby mode as shown in the time period M3 shown in FIG. 9.

Based on aforesaid embodiments, the decoder 346 is a data-aware decoder, which generates the selection signals YSEL1~YSELn in reference with the local write signal LW1 and the local write signal LW2 related to the write data WD.

Similar to aforesaid embodiments about the memory device 100, it is noticed that the main I/O circuit 320, the local I/O circuit 340 of the memory device 300 generate the global write signals GW1/GW2, the local write signals LW1/LW2 and the selection signals YSEL1~YSELn according to the same clock signal CKD. The normal write mode, the bit write mask mode, the read mode or the standby mode in aforesaid embodiments are switched in the main I/O circuit 320, the local I/O circuit 340 according to signals in the time domain relative to the clock signal CKD.

In some other examples, the bit write mask function is performed according to another control signal (e.g., a bitline equalizing signal BLEQB) from another time domain, and there will be a signal racing problem between a control signal (e.g., global write signals GW1 or GW2) in the local time domain and the control signal (e.g., BLEQB) from another time domain. Compared to these examples with the control signal from other time domain, the local I/O circuit 340 of the memory device 300 with reference to the global write signals GW1/GW2 in the local time domain can avoid a signal racing problem and also avoid a crowbar current caused by the signal racing problem.

Also disclosed is a memory device. The memory device includes a memory array, a first latch and a first logic element. The memory array is configured to operate according to a first global write signal. The first latch is configured to generate a first latch write data based on a clock signal.

The first logic element is configured to generate the first global write signal based on the clock signal and the first latch write data.

Also disclosed is a memory device. The memory device includes a first logic element, a second logic element, a first switch, a second switch, a third logic element and a fourth logic element. The first logic element is configured to output a first local write signal based on a first global write signal. The second logic element is configured to output a second local write signal based on a second global write signal. The first switch is configured to provide a reference voltage signal to the first logic element. The second switch is configured to provide the reference voltage signal to the second logic element. The third logic element is configured to control the first switch based on the second global write signal. The fourth logic element is configured to control the second switch based on the second global write signal.

Also disclosed is a method. The method includes: generating a selection signal by a first logic element; transmitting a first local write signal to a first bit line based on the selection signal; transmitting a second local write signal to a second bit line based on the selection signal; providing a reference voltage signal to the first logic element by a first switch; providing the reference voltage signal to the first logic element by a second switch; controlling the first switch by the first local write signal; and controlling the second switch by the second local write signal. The first bit line is different from the second bit line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a memory array configured to operate according to a first global write signal;
    a first latch configured to generate a first latch write data based on a clock signal; and
    a first logic element configured to generate the first global write signal based on the clock signal and the first latch write data.

2. The memory device of claim 1, further comprising:
    a second logic element configured to generate a second global write signal based on the clock signal and a second latch write data,
    wherein the memory array is further configured to operate according to the second global write signal, and
    the second latch write data is reversed from the first latch write data.

3. The memory device of claim 2, further comprising:
    a second latch configured to generate a mask signal based on the clock signal,
    wherein each of the first logic element and the second logic element is configured to receive the mask signal.

4. The memory device of claim 2, further comprising:
    a second logic element configured to generate a first local write signal based on the first global write signal; and
    a first switch configured to adjust a power terminal of the second logic element according to the second global write signal.

5. The memory device of claim 4, further comprising:
    a third logic element configured to generate a second local write signal based on the second global write signal;
    a second switch configured to provide the first local write signal to the memory array; and
    a third switch configured to provide the second local write signal to the memory array,
    wherein a control terminal of the second switch is coupled to a control terminal of the third switch.

6. The memory device of claim 5, further comprising:
    a fourth switch configured to provide the first local write signal to the memory array when each of the second switch and the third switch is turned off; and
    a fifth switch configured to provide the second local write signal to the memory array when each of the second switch and the third switch is turned off,
    wherein a control terminal of the fourth switch is coupled to a control terminal of the fifth switch.

7. The memory device of claim 5, further comprising:
    a fourth switch configured to adjust a power terminal of the third logic element according to the first global write signal.

8. The memory device of claim 7, further comprising:
    a fifth switch coupled in parallel with the fourth switch; and
    a sixth switch coupled in parallel with the first switch,
    wherein a control terminal of the sixth switch is coupled to a control terminal of the fifth switch.

9. A memory device, comprising:
    a first logic element configured to output a first local write signal based on a first global write signal;
    a second logic element configured to output a second local write signal based on a second global write signal;
    a first switch configured to provide a reference voltage signal to the first logic element;
    a second switch configured to provide the reference voltage signal to the second logic element;
    a third logic element configured to control the first switch based on the second global write signal; and
    a fourth logic element configured to control the second switch based on the second global write signal.

10. The memory device of claim 9, further comprising:
    a third switch configured to provide the first local write signal to a memory array; and
    a fourth switch configured to provide the second local write signal to the memory array,
    wherein a control terminal of the third switch is coupled to a control terminal of the fourth switch.

11. The memory device of claim 10, further comprising:
    a fifth switch configured to provide the first local write signal to the memory array; and
    a sixth switch configured to provide the second local write signal to the memory array,
    wherein a control terminal of the fifth switch is coupled to a control terminal of the sixth switch, and
    when each of the fifth switch and the sixth switch is turned on, each of the third switch and the fourth switch is turned off.

12. The memory device of claim 9, wherein logic types of the first logic element, the second logic element, the third logic element and the fourth logic element are the same.

13. The memory device of claim 9, further comprising:
a third switch configured to provide the reference voltage signal to the first logic element according to an enable signal; and
a fourth switch configured to provide the reference voltage signal to the first logic element according to the enable signal.

14. The memory device of claim 13, wherein each of the third switch and the fourth switch is turned off when each of the first switch and the second switch is turned off.

15. A method, comprising:
generating a selection signal by a first logic element;
transmitting a first local write signal to a first bit line based on the selection signal;
transmitting a second local write signal to a second bit line based on the selection signal;
providing a reference voltage signal to the first logic element by a first switch;
providing the reference voltage signal to the first logic element by a second switch;
controlling the first switch by the first local write signal; and
controlling the second switch by the second local write signal,
wherein the first bit line is different from the second bit line.

16. The method of claim 15, further comprising:
controlling each of a third switch and a fourth switch by the selection signal,
wherein transmitting the first local write signal comprises transmitting the first local write signal to the first bit line through the third switch, and
transmitting the second local write signal comprises transmitting the second local write signal to the second bit line through the fourth switch.

17. The method of claim 16, further comprising:
outputting the first local write signal to the third switch by a second logic element; and
outputting the second local write signal to the fourth switch by a third logic element,
wherein logic types of the first logic element, the second logic element and the third logic element are the same.

18. The method of claim 15, further comprising:
pulling low the selection signal according to the first local write signal and the second local write signal.

19. The method of claim 18, wherein pulling low the selection signal comprises:
pulling low the selection signal by a third switch and a fourth switch coupled in series;
controlling the third switch by the first local write signal; and
controlling the fourth switch by the second local write signal.

20. The method of claim 19, wherein each of the first switch and the second switch has a first conductive type, and each of the third switch and the fourth switch has a second conductive type different from the first conductive type.

* * * * *